(12) United States Patent
Werking

(10) Patent No.: US 7,552,637 B2
(45) Date of Patent: Jun. 30, 2009

(54) TORQUE DRIVING CIRCUIT

(75) Inventor: Paul M. Werking, Rockford, MN (US)

(73) Assignee: Honeywell International Inc., Morristown, NJ (US)

(*) Notice: Subject to any disclaimer, the term of this patent is extended or adjusted under 35 U.S.C. 154(b) by 364 days.

(21) Appl. No.: 11/533,192

(22) Filed: Sep. 19, 2006

(65) Prior Publication Data

US 2008/0066561 A1     Mar. 20, 2008

(51) Int. Cl.
*G01P 15/08* (2006.01)
(52) U.S. Cl. ................................. 73/514.18
(58) Field of Classification Search .......... 73/514.17, 73/514.18, 514.21, 514.22, 514.23, 514.29, 73/514.16, 514.32
See application file for complete search history.

(56) References Cited

U.S. PATENT DOCUMENTS

| | | | | | |
|---|---|---|---|---|---|
| 3,877,313 | A | * | 4/1975 | Ferriss | 73/514.05 |
| 4,009,607 | A | * | 3/1977 | Ficken | 73/862.61 |
| 4,094,199 | A | * | 6/1978 | Holdren et al. | 73/514.22 |
| 4,102,202 | A | * | 7/1978 | Ferriss | 73/514.18 |
| 4,336,718 | A | * | 6/1982 | Washburn | 73/497 |
| 4,345,474 | A | * | 8/1982 | Deval | 73/514.18 |
| 4,459,849 | A | * | 7/1984 | Calamera | 73/514.22 |
| 4,799,386 | A | * | 1/1989 | Bernard et al. | 73/514.18 |
| 5,142,921 | A | * | 9/1992 | Stewart et al. | 73/866.1 |
| 5,235,330 | A | * | 8/1993 | Sewell | 340/967 |
| 6,360,602 | B1 | * | 3/2002 | Tazartes et al. | 73/514.18 |

OTHER PUBLICATIONS

Boxenhorn, Burton and Greiff Paul, "An Electrostatically Rebalanced Micromechanical Accelerometer," AIAA Guidance, Navigation and Control Conference, Aug. 14-16, 1989, Boston Massachusetts, American Institute of Aeronautics and Astranautics, Inc., 1989, pp. 117-122.

Boxenhorn, Burton and Greiff Paul, "Monolithic Silicon Accelerometer," The Charles Stark Draper Laboratory, Cambridge, Massachusetts, Elsevier Sequoia, pp. 273-275.

Boxenhorn, Burton and Greiff Paul, "Monolithic Silicon Accelerometer," The Charles Stark Draper Laboratory, Cambridge, Massachusetts, Elsevier Sequoia, pp. 273-275, 1990.

Coughlin R F; Driscoll F F: "Operational amplifiers and linear integrated circuits", Book, 1987, Prentice-Hall, Engelwood Cliffs, NJ, US, XP002518190 *pp. 167-172*.

* cited by examiner

*Primary Examiner*—Helen C. Kwok
(74) *Attorney, Agent, or Firm*—McDonnell Boehnen Hulbert & Berghoff LLP

(57) ABSTRACT

A torque driver that includes a regulator circuit for mitigating zero-g discontinuity effects and deadbanding is presented. An accelerometer may comprise the torque driver and the torque driver may be arranged to receive a control signal from a control circuit that is coupled to deflection sensing circuitry. When the accelerometer undergoes an acceleration the deflection sensing circuitry generates an acceleration signal that is communicated to the control circuit. The control circuit responsively generates a control signal, which the torque driver users to balance a proof mass beam within the accelerometer. The regulator circuit mitigates zero-g discontinuity effects and deadbanding by preventing the torque signal from producing torque signals that simultaneously track the control signal. To do this, the regulator circuit may include a rectifying buffer and/or a modulator.

15 Claims, 8 Drawing Sheets

TORQUE DRIVING CIRCUIT

GOVERNMENT RIGHTS

The United States Government may have acquired certain rights in this invention pursuant to Contract No. DAAE30-01-9-0100 awarded by the Army.

FIELD

The invention relates to the field of accelerometers, and more particularly to circuitry for operating a MEMS based accelerometer.

BACKGROUND

Accelerometers are used in a variety of applications ranging from inertial guidance systems to airbag deployment systems in modern automobiles, as well as in many other scientific and engineering systems. Commonly, an accelerometer may be micro electromechanical system (MEMS) based and available in a wide variety of acceleration sensing ranges of up to thousands of g's. In addition, single axis, dual axis, and three axis configurations are available. A proof mass beam of a MEMS based accelerometer may comprise either a simple cantilever beam or a dual compound cantilever (teeter-totter) with a fulcrum that is displaced from its center of mass. Either type of MEMS beam may be used in an open-loop or a closed-loop accelerometer system. In both open-loop and closed-loop systems, the MEMS mechanism contains a set of one or more plates to detect deflection of the proof mass beam. In closed-loop systems, the MEMS mechanism contains an additional set of two or more plates to control the position of the proof mass. These "drive" or "torque" plates are used to hold the proof mass at a relatively fixed position via attractive electrostatic forces. Such a "rebalancing" accelerometer system has an extended range of operation and minimizes distortion in the sensed acceleration.

When an accelerometer undergoes an acceleration, the deflection sensing circuitry measures small changes in displacement or deflection (e.g., in a cantilever beam). A control circuit then generates a control or "torque" voltage to rebalance the proof mass and minimize its deflection. Typically, the torque driver circuit then switches this voltage to the correct plate (right or left) to assert the required force. The torque driver circuit may also amplify the torque voltage to allow operation of the control circuit at a lower voltage. This force, which continuously receives feedback via the deflection sensing circuitry, correctively balances the accelerometer. The magnitude of the voltage signals used to provide the corrective force, is then an indicator as to the magnitude and direction of acceleration that an accelerometer is undergoing.

SUMMARY

For the most part, this sensing and balancing scheme is effective for a positive or negative acceleration that is larger than a few mg's. However, as acceleration approaches zero-g, a dead-band or sharp discontinuity in the measured acceleration may occur due to small offsets and noise in the control and drive circuits. Although small (often ranging from 1 to 100 milli-g's), these errors are due to switching artifacts. For example, a transition from positive to negative acceleration (or vice-versa) may produce infinite loop gain or zero loop gain, both of which may lead to a variety of problematic consequences, including control loop instabilities.

Therefore, a torque driver is presented. The torque driver, for example, may be used as balancing circuitry within an accelerometer and may prevent zero-g discontinuity effects and significantly reduce dead-banding. By way of example, an example torque driver comprises a rectifying buffer. An output node of the rectifying buffer produces a torque signal, which may be used to physically drive an accelerometer. At a differential input, the rectifying buffer receives the torque signal and a control signal, which may be communicated from a control circuit, for example. In operation, the torque driver mitigates zero-g discontinuity effects and/or dead-banding by using the buffer to prevent the torque signal from following the control signal when the control signal drops below a predetermined threshold.

In an additional or alternative example, if the control signal is a voltage signal, the predetermined threshold may be zero volts. Depending on the configuration, the buffer may prevent the torque signal from following the control signal when the control is either positive or negative.

In yet another example, the buffer may include an amplifier coupled to a transistor. The amplifier and the transistor may be arranged so that when a voltage difference occurs across the differential input of the buffer, the torque signal scales in magnitude with the voltage difference. When the control signal is below the predetermined threshold, however, the torque signal may remain fixed or constant, such as at ground potential. In addition, the amplifier may be also configured to receive an offset signal to reduce an offset that may be inherent to the amplifier.

Another exemplary driver circuit may include two or more rectifying buffers, which may be referred to as left and right buffers although other notations are possible (e.g., top and bottom, first and second, etc.) In the example, the left and right buffers each receive a control signal. The left and right buffers are arranged so that only one of the buffers follows the control signal at a given time. For example, when the control signal is positive, the right buffer may track the control signal and when the control signal is negative, the left buffer may track the control signal.

Another exemplary torque driver may include a regulator circuit. The regulator circuit may be configured to prevent the two torque signals from following the control signal at the same time. In one example, the regulator circuit comprises a switch, or a modulator, for determining which of first and second torque signals is to follow the control signal. The modulator may be further coupled to receive a selector signal for selecting a torque signal that is to follow the control signal while the other torque signal is selected to follow a bias signal having a fixed input impendence. In an alternative example, the regulator circuit may comprise a rectifying buffer.

These as well as other aspects and advantages will become apparent to those of ordinary skill in the art by reading the following detailed description, with reference where appropriate to the accompanying drawings. Further, it is understood that this summary is merely an example and is not intended to limit the scope of the invention as claimed.

BRIEF DESCRIPTION OF THE DRAWINGS

Certain examples are described below in conjunction with the appended drawing figures, wherein like reference numerals refer to like elements in the various figures, and wherein:

FIGS. 1 A-B are an isometric diagram of an accelerometer and a block diagram of deflection sensing, control, and torque driving circuitry, which may be used to control a proof mass beam within the accelerometer, according to an example;

DETAILED DESCRIPTION a) Accelerometer Turning now to the figures.

Figures 1A, 1B:
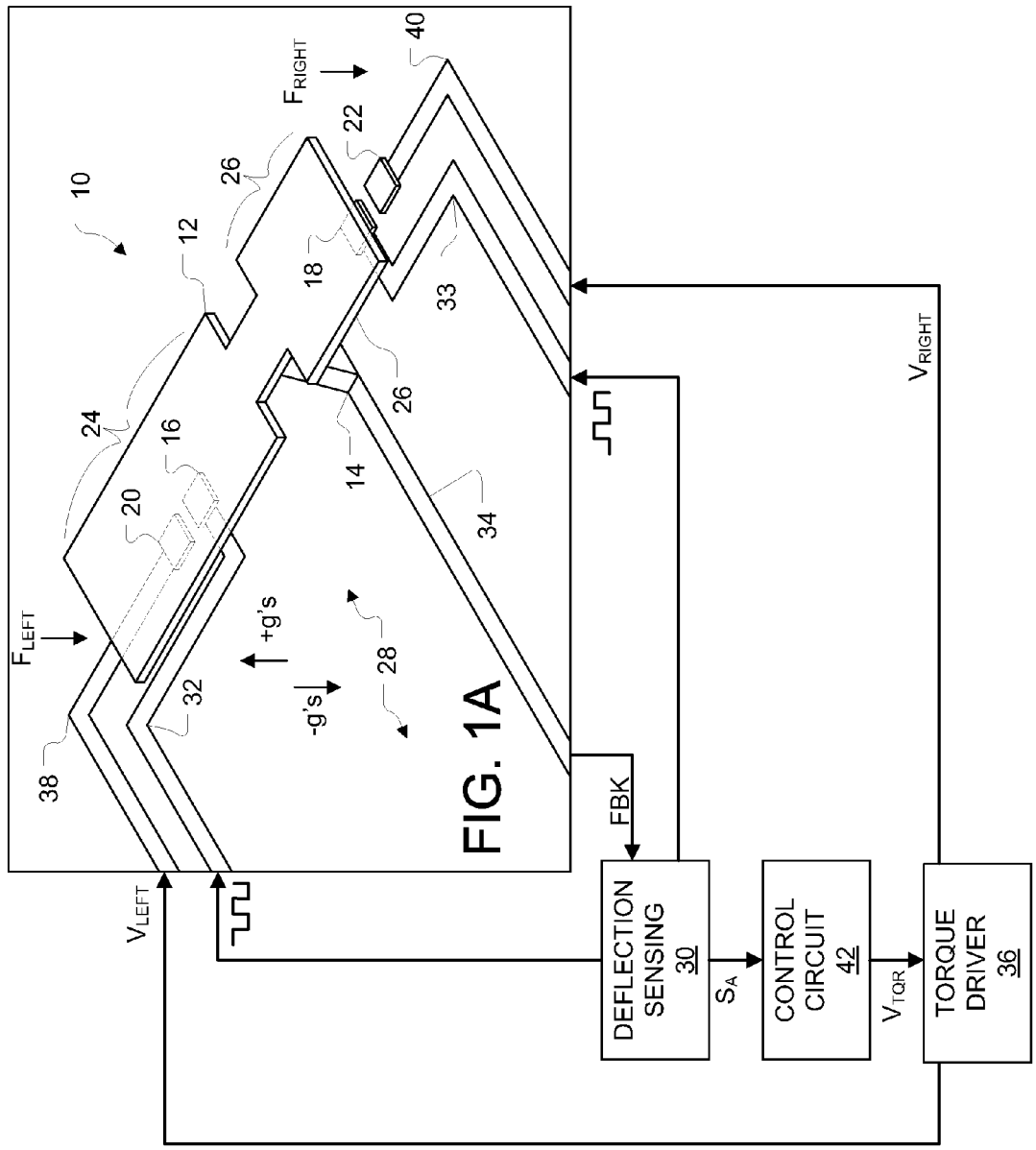
FIG. 1A is an isometric diagram of an accelerometer 10 that includes a proof mass beam 12, a fulcrum 14, sense pads 16, 18, and torque pads 20, 22 (It should be noted that the beam 12 and the fulcrum 14, together with sense and torque pads, may be referred to as a mechanism). The beam 12 includes cantilevers 24, 26 that extend from the fulcrum 14. The fulcrum 14 is positioned on a substrate 28 so that the cantilever 24 extends over the sense pad 16 and the torque pad 20 and so that the cantilever 26 extends over the sense pad 18 and the torque pad 22. The cantilever 24 is about twice the length of the cantilever 26, while both the sense pads 16, 20 and torque pads 20, 22 are each at an equidistant spacing from the fulcrum 14. The extra length of the cantilever 24 acts as a "proof mass," which is used for sensing acceleration.

Generally speaking, the beam 12 comprises a metal, such as aluminum or copper, however other materials are possible. The fulcrum 14 may similarly comprise a metal or a conducting material (i.e. crystalline or poly silicon). The substrate 28 may be insulative and may include a dielectric such as glass (i.e., Pyrex) or a silicon-dioxide. The sensing pads 16, 18 may comprise a metal or a silicided material and are used by the deflection sensing circuitry to measure a capacitance between each of them and the beam 12, which may be biased or grounded. The torque pads 20, 22 are also metal or silicided and are used by a torque driving circuit to "balance" the beam 12.

FIG. 1B is a block diagram that represents circuitry that may be coupled to the accelerometer 10. The sense pads 16, 18 and the fulcrum 14 are coupled to deflection sensing circuitry 30 via lines 32-34. The force pads 20, 22 are coupled to a torque driver 36 via lines 38, 40. The torque driver 36 is coupled to a control circuit 42, which receives a deflection signal, $S_A$, from the deflection circuitry 30. The deflection signal $S_A$ is directly proportional to acceleration, and the control circuit 42 uses the deflection signal $S_A$ to produce a control signal, $V_{TQR}$, that is communicated to the torque driver 36.

In operation, the deflection circuitry 30 may include an amplifier, which produces an oscillating voltage output at a suitably high oscillation frequency. A suitable oscillator for sensing capacitance should operate at a frequency above the mechanical resonance of the cantilevers 24, 26, which may be generally, in the range of 1-10 kHz. The deflection circuitry 30 communicates a voltage waveform (e.g., a square wave) to each of the sense pads 16, 28. The waveforms may be identical but 180 degrees out of phase from each other. If the two waveforms remain separated by 180 degrees, the signal line 34 will carry a voltage of zero volts when the cantilevers are balanced. However, if either of the cantilevers 24, 26 are deflected, a waveform is generated at the fulcrum 14 and communicated via the signal line 34 to the deflection circuitry 30. The phase of such a waveform serves as an indictor as to the direction of the acceleration. Accordingly, the deflection circuitry 30 produces an acceleration signal $S_A$. The acceleration signal $S_A$ is correlative with the capacitance difference, which may be a "raw" signal fed from the signal lines 34 or a processed version of the raw signal, which is carried out via the control circuit 42 to produce the control signal $V_{TQR}$.

b) Balancing the Proof Mass

Upon receiving the control signal $V_{TQR}$, the torque driver 36 produces torque signals, $V_{LEFT}$ and $V_{RIGHT}$, which are used to rebalance the beam 12 so that the beam 12 is near a zero-g or "rest" position. Since the electrostatic force of the rebalancing voltages cancel the applied acceleration they are indicative of an acceleration exerted on the accelerometer 10. The beam 12 is balanced by "pulling" at least one of the cantilevers 24, 26 toward the substrate 28. "Pulling" may be achieved by creating a voltage difference between the beam 12 and a torque pad. The voltage difference creates an electrostatic force (shown as $F_{LEFT}$ and $F_{RIGHT}$) that acts on either of the cantilevers 24, 26. It should be noted that both positive and negative voltage potentials will pull a cantilever toward the substrate 28.

If, for example, a positive acceleration causes the cantilever 26 to move away from the substrate 28 and the cantilever 24 to move toward the substrate 28, a voltage signal at the torque pad 22 will pull the cantilever 26 towards the substrate 28 and the cantilever 24 away from the substrate 28. The voltage signal at the torque pad 22 may be increased until the deflection signal, $S_A$, indicates that the beam 12 is balanced. If the acceleration becomes negative, a voltage may be applied at the torque pad 20, which may be used in a similar manner to pull the cantilever 24 towards the substrate 28 and the cantilever 26 away from the substrate 28.

The net force applied to the beam 12 is a function of the applied torque voltages as follows:

$$F = m \times A = (C/d) \times [V_{LEFT}^2 - V_{RIGHT}^2]$$

where $V_{LEFT}$ is the voltage applied to the torque pad 20, $V_{RIGHT}$ is the voltage applied to the torque pad 22, C and d are respectively the capacitance and the distance between the beam 12 and the substrate 28. The above equation assumes that the capacitances or areas of the sense pads 20, 22 are equal and equidistant from the fulcrum 14. It further assumes that both of the sense pads 20, 22 are equidistant from the beam 12 and that the distance, d, is a constant. The force and acceleration vectors, F and A, are defined to be in the opposite directions. Likewise, the mass, m, is defined as the difference between the masses associated with each of the cantilevers 24, 26.

To maximize the torque applied to the beam 12 (or to efficiently balance the beam 12) only one of the torque pads 20, 22 should receive a voltage at a time. That is, when a voltage is applied to the torque pad 20, a voltage should not be applied to the torque pad 22 (and vice-versa). FIGS. 2A-D are example graphs that show a deflection signal, a control signal, the torque voltages, and the rebalancing force applied to the beam 12.

Figure 2:
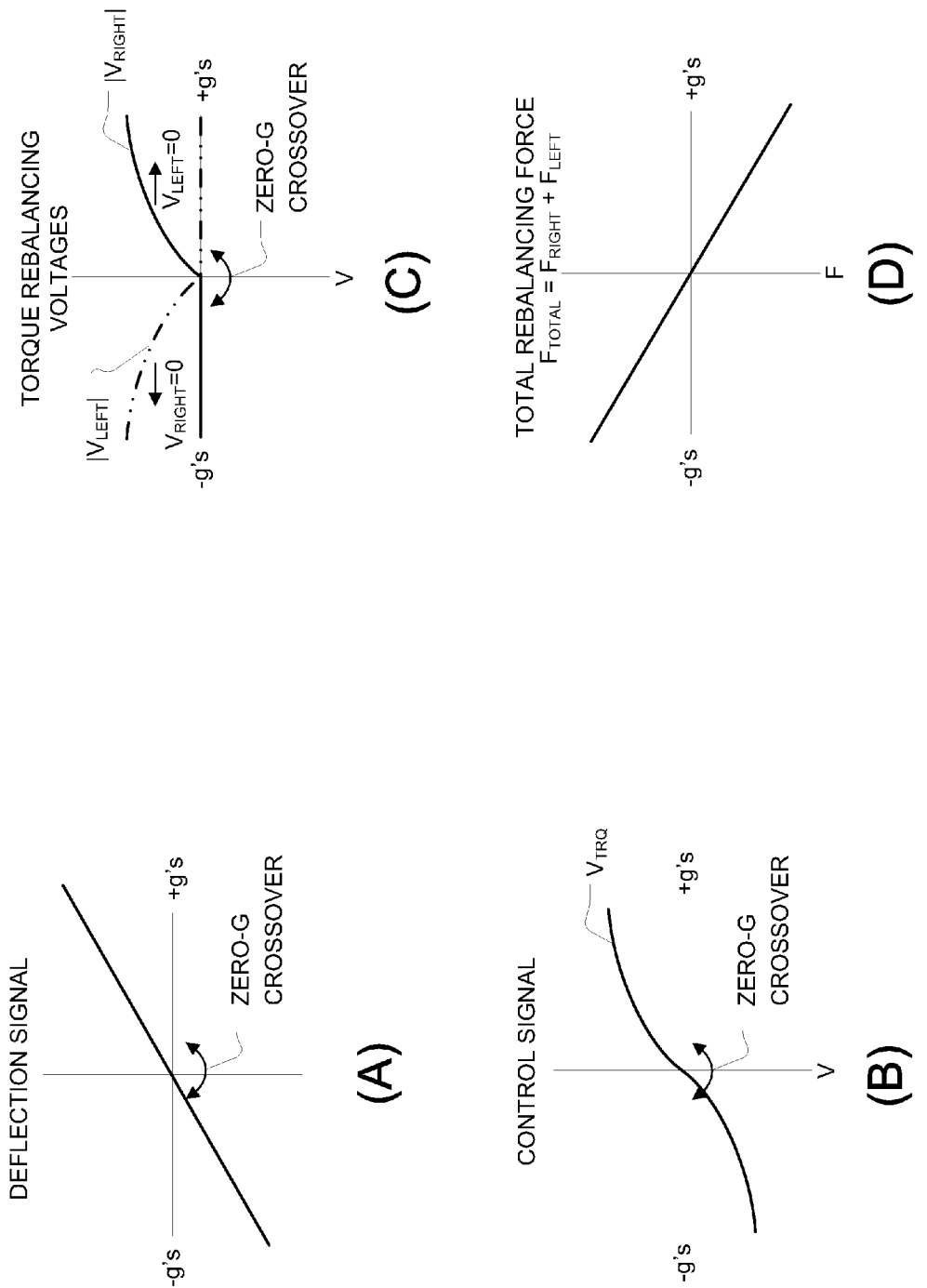
FIGS. 2 A-D are graphs respectively illustrating a deflection signal, a control signal, torque signaling, and a resultant force that may be applied to a proof mass beam, according to an example.

FIG. 2A shows the actual deflection of the proof mass with acceleration. To a first order, this generates the $S_A$ signal at the output of 30. FIG. 2B shows the resultant control signal $V_{TQR}$ that is created when the beam 12 is positively and negatively accelerated (ranges from −g's to +g's). As the magnitude of the acceleration increases, the magnitude of the control signal $V_{TQR}$ increases. The control signal $V_{TQR}$ is ideally zero at the origin (i.e., at zero-g). Note that according to the formula described above, the control signal is proportional to the square root of the magnitude of the acceleration input.

FIG. 2C shows an example of the two torque plate voltages that are generated in response to the control signal $V_{TQR}$ as shown in FIG. 2B. As the control signal $V_{TQR}$ increases in magnitude, the torque signals likewise increase. Similarly, as the control signal $V_{TQR}$ decreases in magnitude (i.e., moves towards the origin of FIG. 2B), the torque signal applied at the torque pad 22 ($V_{RIGHT}$) follows the control signal $V_{TQR}$ by likewise decreasing. Note that FIG. 2C combines two voltages on one graph. For values of g>0, $V_{LEFT}=0$ and, for values of g<0, $V_{RIGHT}=0$. One goal of the torque signal may be to produce a linear rebalancing force or "torque" on the beam 12, which is substantially equal in magnitude but opposite to the applied acceleration. FIG. 2D shows the total rebalancing force applied to the beam 12.

At the origin of the graph of FIG. 2C, which is about zero-g, the torque driver 36 switches the voltages applied at the torque pads 20, 22. For example, if the acceleration is increasing from negative to positive, torque signaling will be applied at the torque pad 22, and will not be applied at the torque pad 20. Alternatively, if the acceleration is decreasing from positive to negative, torque signaling will be applied at the torque pad 20, and will not be applied at the torque pad 22. Advantageously, the torque driver 36 includes regulator circuitry that allows only one of the torque signals, either $V_{LEFT}$ or $V_{RIGHT}$, to follow the acceleration at a time. In doing so and in particular at zero-g, the torque driver 36 prevents zero-g discontinuity effects and/or deadbanding from influencing the torque signal as well as the applied force, $F_{LEFT}+F_{RIGHT}$ (see FIG. 2D).

c) "Switch" Based Torque Driver

Figure 3:
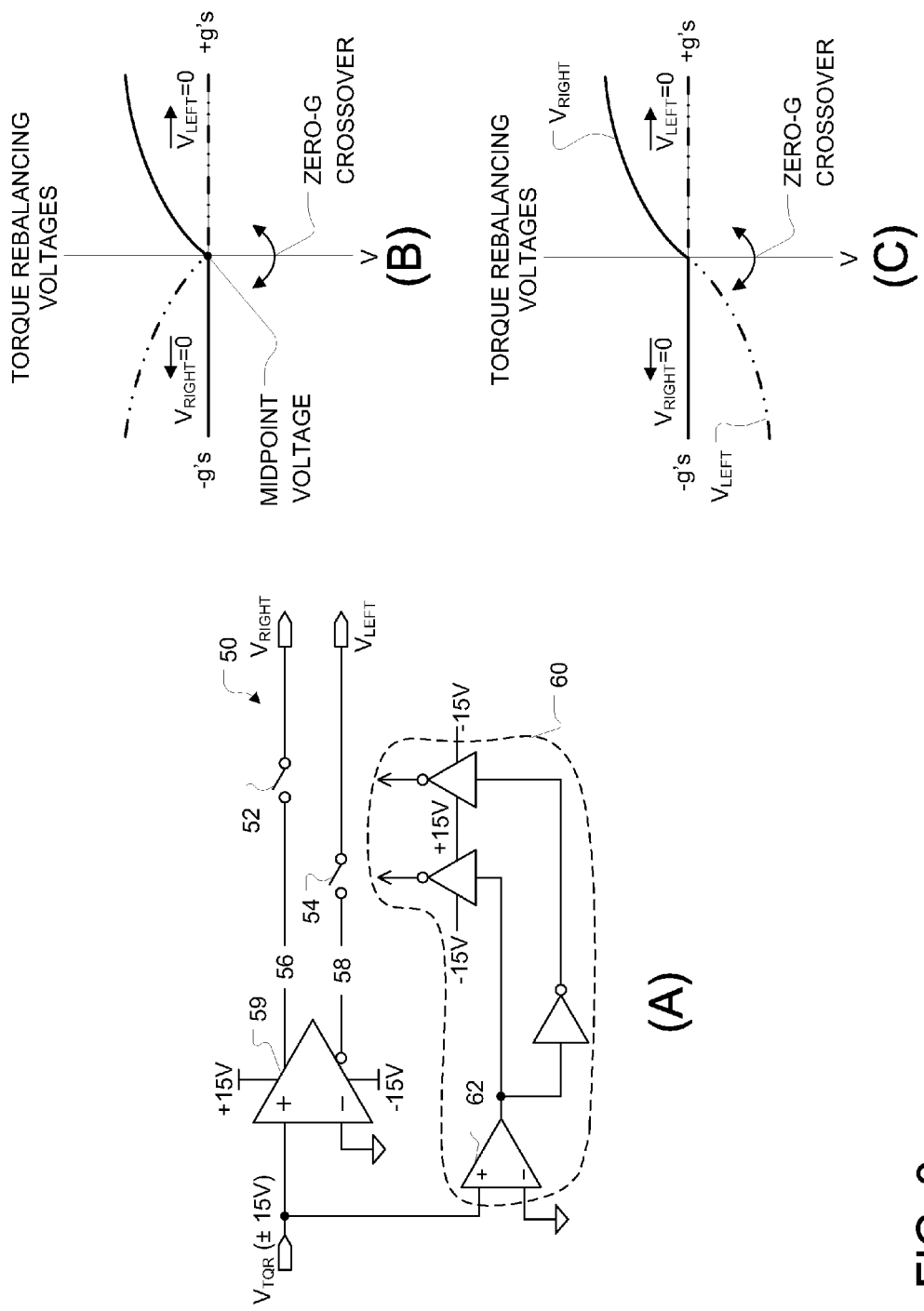
FIGS. 3 A-E are schematic diagrams of "switch" based torque drivers and associated signaling diagrams, according to an example.
Figure 3:
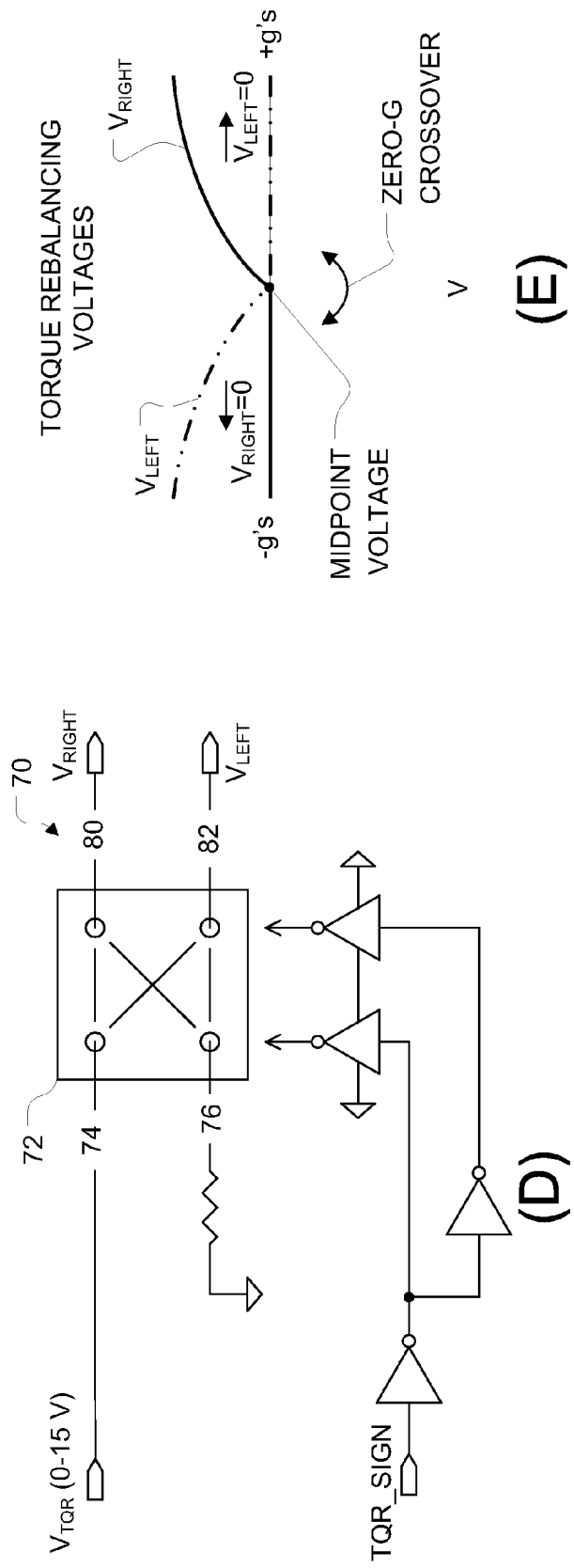

FIG. 3A is a block diagram of a "switch" based torque driver 50, which is configured to prevent the torque signals $V_{LEFT}$ and $V_{RIGHT}$ from simultaneously following a control signal, such as the control signal $V_{TQR}$. The torque driver 50 includes switches 52, 54, which are coupled to receive the torque signal $V_{TQR}$ and an inverse of the torque signal $V_{TQR}$ (via signal lines 56, 58) from an amplifier 59. The switches 52, 54 are coupled to a switch driver 60 includes a comparator 62, which toggles the switches 52, 54 so that only one of the control signals (i.e., $V_{TQR}$ or the inverse of $V_{TQR}$) produces a torque signal. For example, if the control signal $V_{TQR}$ is in the range of 0 to 15 volts, the comparator 62 may produce an output that causes the switch 52 to close (and the switch 54 to remain open). In this case, the torque signal at $V_{RIGHT}$ may follow the control signal $V_{TQR}$. On the other hand, if $V_{TQR}$ is in the range of −15 to 0 volts, the comparator 62 may cause the switch 54 to close (and the switch 52 to remain open), causing the torque signal at $V_{LEFT}$ to follow an inverse of the control signal VTQR. FIG. 3B is a graph of torque voltages that will be produced using the torque driver 50.

In a variation of this technique, both switches 52 and 54 may be connected to the non-inverting output 56 of the amplifier 59. In this case, the two torque voltage outputs are as shown in FIG. 3C. Both techniques are equivalent since they apply the same force to the proof mass. It is understood that amplifier 59 may have a fixed gain that may be determined by an arrangement of resistors (not shown).

FIG. 3D is another block diagram of a "switch" based torque driver 70, which is configured to prevent the torque signals $V_{LEFT}$ and $V_{RIGHT}$ from simultaneously following a control signal. The torque driver 70 includes a 2×2 crosspoint switch, or a modulator 72, which is coupled to receive a torque signal and a bias signal respectively applied to signal lines 74, 76. The switch 70 is arranged so that a select signal, TQR_SIGN, which is input at a switch driver 78, may toggle which of two signal lines 80, 82 is to output the torque signal and which of the signal lines 80, 82 is to output the bias signal. In this example, the control signal $V_{TRQ}$ may be in a range of about 0 to 15 volts. When the acceleration crosses zero-g, the select signal may accordingly toggle the torque signal. FIG. 3E shows a graph of torque signals that may be produced by the torque driver 70.

d) "Rectifying Buffer" Based Torque Driver

Figure 4:
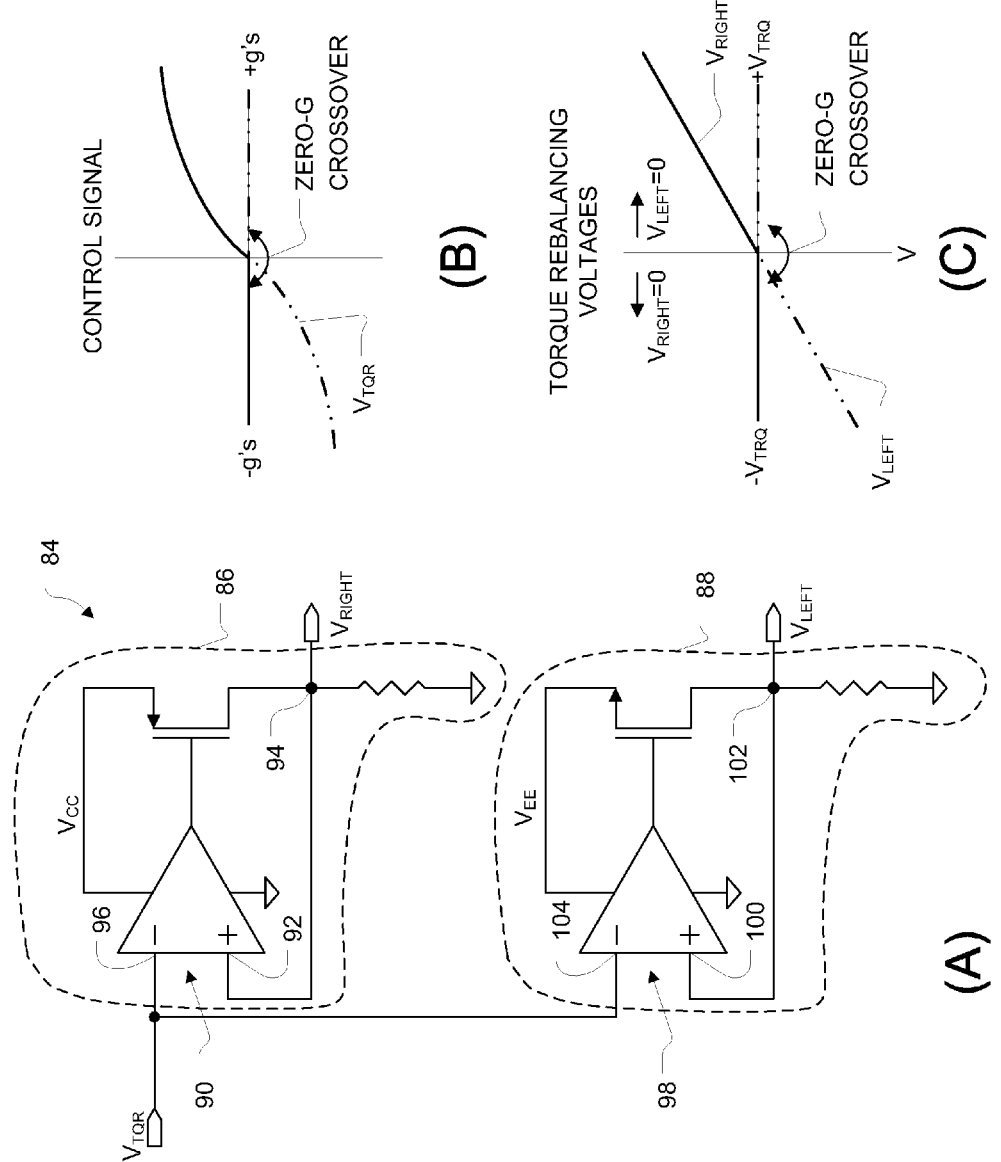
FIGS. 4 A-C are a schematic diagram of a "rectifying buffer" based torque driver and associated signaling diagrams, according to an example.

An alternative to the "switch" based torque driver 50, is a "rectifying buffer" based torque driver 84, shown in FIG. 4A. Unlike the "switch" based torque driver 70 the torque driver 84 may have a zero-g cross-over at 0V, which may take away the need for a select signal. The rectifying buffers, in lieu of the switch 72, inhibit a torque signal from following a control signal. In particular, a rectifying buffer will output a constant bias, such as a ground signal, when the acceleration signal drops below a predetermined threshold.

The torque driver 84 includes a pair of rectifying buffers 86, 88. The buffer 86 includes a differential input amplifier 90. A terminal 92 of the differential input amplifier 90 is coupled to an output node 94. Another terminal 96 of the differential input amplifier 90 is coupled to receive the control signal $V_{TRQ}$. Similarly, the buffer 88 includes a differential input amplifier 98 having a terminal 100 coupled to an output node 102 and another terminal 104 coupled to receive the control signal $V_{TRQ}$. FIG. 4B is a graph that shows the control signal $V_{TRQ}$ ranging from a negative acceleration (−g's) to a positive acceleration (+g's).

FIG. 4C shows a graph of the torque signaling created by the torque driver 84, which is responsive to the control signal $V_{TRQ}$. When an accelerometer undergoes a negative acceleration, the rectifying buffer 88 creates a voltage signal, $V_{LEFT}$, at the output node 102, which follows the control signal $V_{TRQ}$. During a negative acceleration the voltage at the output node 94 ($V_{RIGHT}$) is at a constant bias (e.g., zero volts). When the acceleration becomes positive, however, the buffer 88 outputs a constant bias at the output node 102 and the buffer 86 begins to follow the control signal $V_{TRQ}$, producing a voltage signal $V_{RIGHT}$, which follows the control signal $V_{TRQ}$. The buffers 86, 88 are arranged so that only one amplifier is following the control signal $V_{TRQ}$ at a time.

To do this, the buffer 86 comprises an amplifier coupled to a p-type field effect transistor (PFET). The buffer 88, on the other hand, comprises an amplifier coupled to an n-type FET (NFET). When the voltage at the input node 96 is negative, the amplifier within the buffer 86 cause the PFET to shut-off, and a constant bias of zero volts is generated by the resistor. Similarly, when the voltage at the input node 104 is positive, the amplifier within the buffer 88 is causes the NFET to shut-off, and a constant bias of zero volts is generated.

In the realization of any torque driver circuit, it is important to consider that switching from the left to right outputs occurs at zero volts, or as close to zero volts as possible. In the circuit of FIG. 3A, this may be limited by the input offset voltage of the comparator 62 and may be further compounded by the offset of the amplifier 59. In the worst case, these two offsets could add so as to produce a discontinuity at g=0, when the outputs switch, that is equal to the sum of their offset voltages. In the circuit of FIG. 4A, however, the "effective switching point" of the two rectifying buffers 86, 88 is not as important as long they both match. Therefore, the largest amount of discontinuity or dead band that can be produced when the outputs switch is equal to the difference in the offset voltages of comparators 90 and 98. This can be made to be at least an order of magnitude less than that produced by the circuit of FIG. 3A by using matched amplifiers on the same semiconductor substrate. If desired, this effect may be reduced further by adjusting the offsets of one or both of the amplifiers 90, 98 using any number of techniques.

Figure 5:
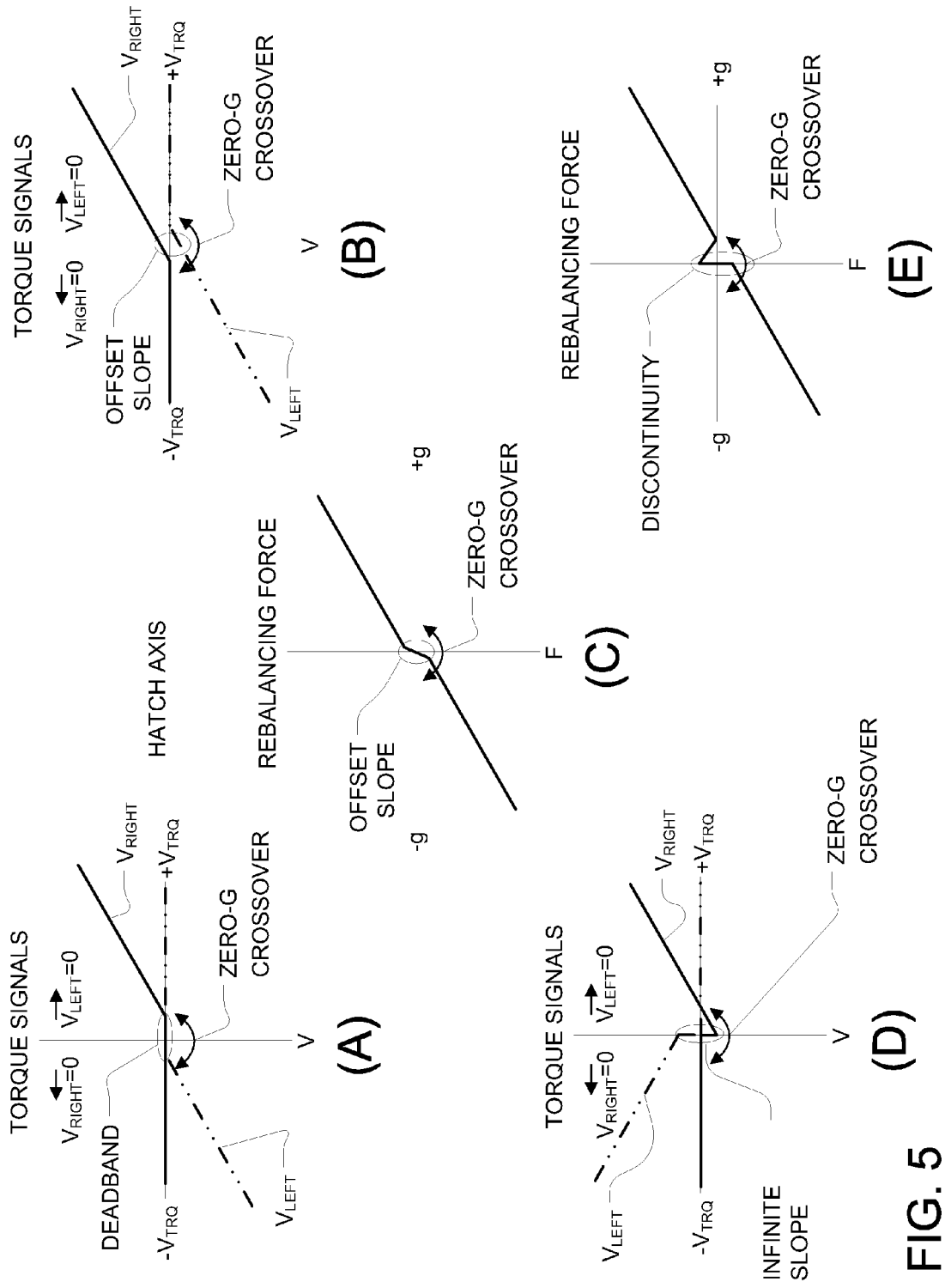
FIGS. 5 A-E are graphs illustrating variations of a torque signal generated by a torque driver, according to an example.

Furthermore, the rectifying buffers 86, 88 of FIG. 4A are incapable of producing a true zero-g discontinuity in the manner that the circuits of FIGS. 3A and 3C do. This is illustrated by the graphs in FIGS. 5A-E. FIG. 4C, for example, shows the nominal transfer curves the left and right outputs of the rectifying buffer circuit of FIG. 4A when both of the amplifiers 90, 98 have zero DC offset. If both of the amplifiers 90, 98 have an equal positive input offset voltage, then this set of curves will be shifted to the right by that offset voltage. Likewise, if they both have equal negative offset voltages, then the curves of FIG. 4C will be shifted left by that offset voltage. Now consider what happens when the two offset voltages of the amplifiers 90, 98 are not equal. FIG. 5A shows what happens when the amplifier 90 has a positive offset and the amplifier 98 has a negative offset. Here, $V_{RIGHT}$ is shifted right and $V_{LEFT}$ is shifted left. Note that there is a region near zero where both $V_{RIGHT}$ and $V_{LEFT}$ are zero. The width of this "dead band" region where the two curves overlap may be found by simply taking the difference of the two offset voltages. FIG. 5B shows what happens when the roles are reversed; when the amplifier 90 has a negative offset and the amplifier 98 has a positive offset. Here, $V_{RIGHT}$ is shifted left and $V_{LEFT}$ is shifted right. Note that there is a region near zero where both $V_{RIGHT}$ and $V_{LEFT}$ are not zero. The width of this "gap" region where the two curves do not overlap may also be found by simply taking the difference of the two offset voltages. However, as shown in FIG. 5C, this does not result in a severe discontinuity in the net force applied to the proof mass. Instead, the slope of the force vs. acceleration curve inside this region is twice what it is outside this region. In contrast, consider the curve of FIG. 5D which shows one possible type of discontinuity for the circuit of FIG. 3A that could occur if the offset of the amplifier 59 is not accounted for properly. Here the amplifier 59 has a positive offset and the comparator 62 has no offset. Note the infinite slope of this curve at the discontinuity. This type of discontinuity may be deleterious because it may induce a mechanical oscillation. FIG. 5E shows a resultant disjointed slope in an associated force vs. acceleration curve due to the discontinuity at g=0.

e) "Rectifying Buffer" as a Building Block

Figure 6:
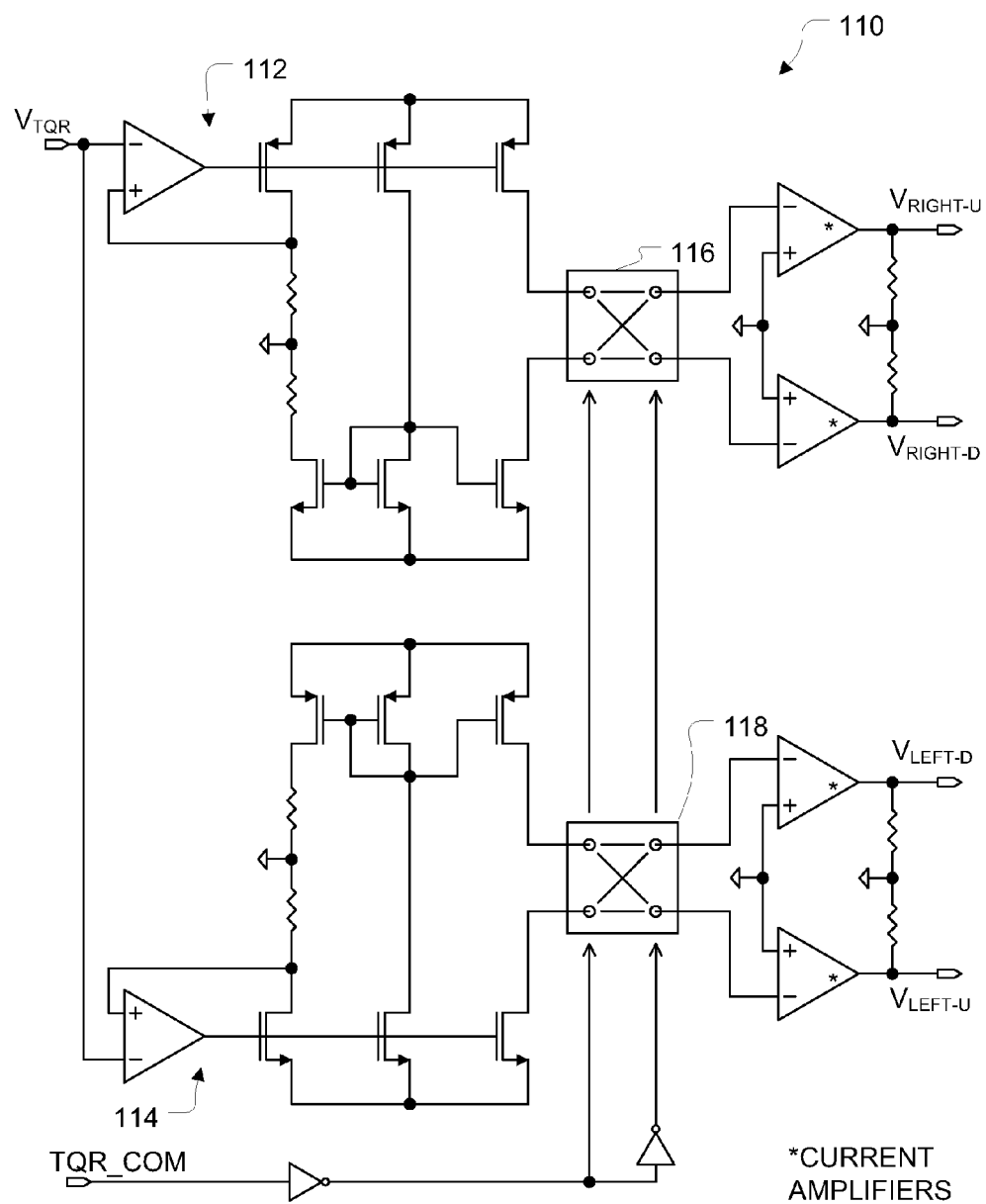
FIG. 6 is a schematic diagram of torque driver configured to output an AC voltage signal, according to an example.

The rectifying buffer(s), and/or the switch(es) described above, may be used in a variety of configurations to achieve a desired torque driver. FIG. 6 shows an example torque driver 110, which outputs a set of AC torque signals, $V_{RIGHT-U}$, $V_{RIGHT-D}$, $V_{LEFT-D}$, $V_{LEFT-U}$. Unlike the torque drivers 50, 70, 84, the torque driver 110 is configured to output an AC torque signal to an upper and lower torque plate on both the left and right sides of the fulcrum. AC torquing, for example, may be required when driving a sensor built on a Pyrex substrate rather than a $SiO_2$ substrate. This is due to a "Pyrex charging" effect that, over time, acts like a DC offset error on the torque plates. AC torquing also allows the torque voltages to be capacitively coupled to the mechanism torque plates, which may eliminate the effect of DC offset voltages in the drive circuits. The torque driver 110 includes rectifying buffers 112, 114 and crosspoint switches 116, 118. The buffers 112, 114 receive the control signal $V_{TRQ}$. The switches 116, 118 are configured to cross or switch outputs of the buffers 112, 114 under the control of a square wave applied to the TQR_COM input. For proper operation, the frequency of this AC commutation should exceed the natural resonant frequency of the mechanism in order to prevent mechanical vibrations and the attendant vibration rectification errors.

f) "Rectifying Buffer" Coupled to Fulcrum

Figure 7:
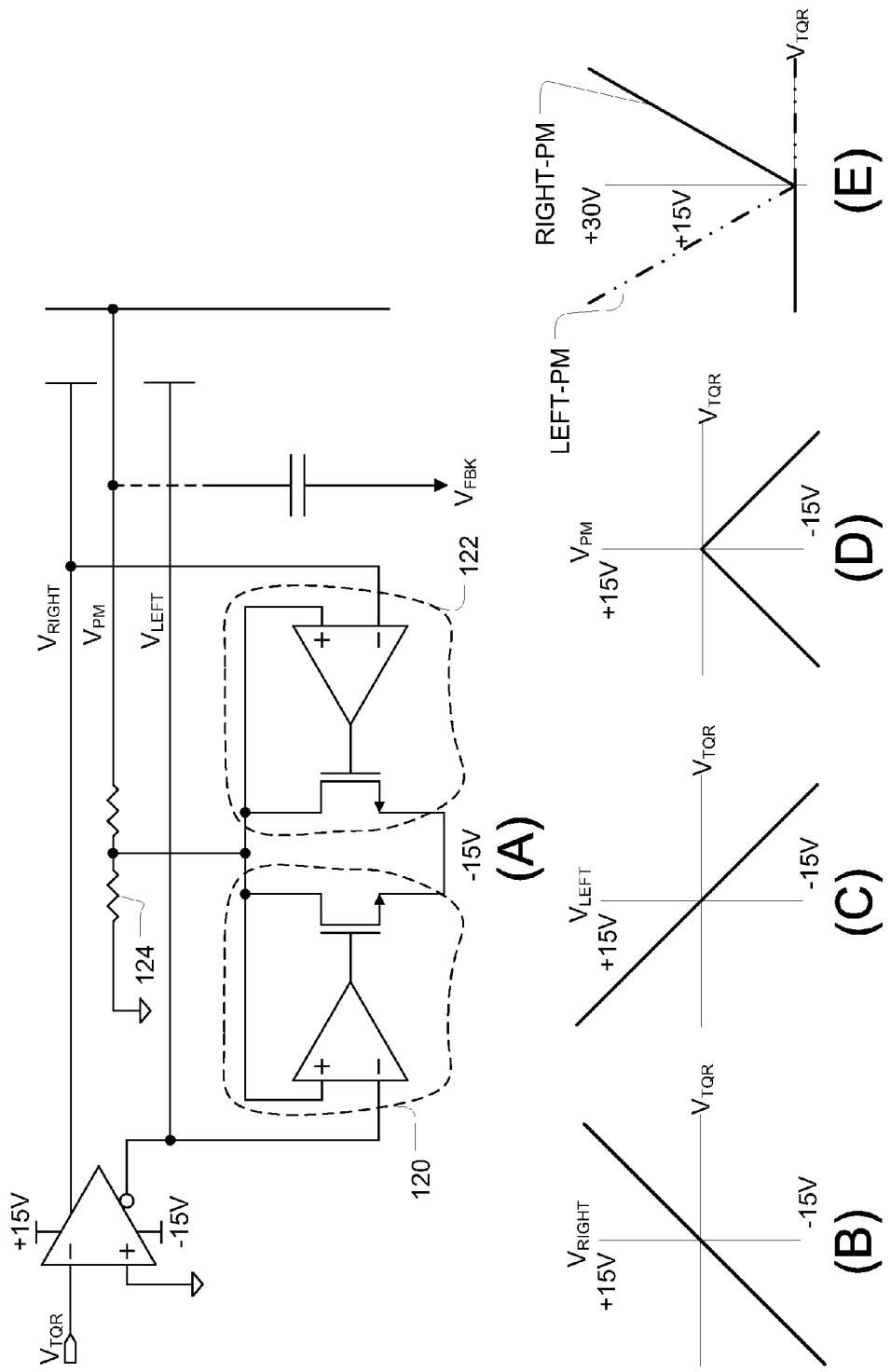
FIGS. 7A-E are a schematic diagram of rectifying buffer circuits and associated signaling diagrams, where the rectifying buffer circuits are arranged to drive a fulcrum of a proof mass beam, according to an example.

Another configuration is shown in FIG. 7A where a pair of rectifying buffer circuits 120, 122 are coupled together by a common resistor 124 and used to actively drive a proof mass. In this fashion, both the torque plates and the proof mass are driven simultaneously so that twice as much potential difference may be realized between them for a given supply voltage as illustrated in FIGS. 7B-E. By doubling the voltage drive, the force over which the proof mass may be rebalanced is quadrupled. For example, suppose that a given mechanism has a range of ±70 g's when driven by any of the previous torque drive circuits having +15V and −15V supplies. When driven by the circuit of FIG. 7A, this same mechanism has a range of ±280 g's.

The two rectifying buffers in this circuit generate the $V_{PM}$ voltage (FIG. 7D) by effectively buffering the lower of the two torque plate voltages, $V_{RIGHT}$ and $V_{LEFT}$. (The voltage $V_{PM}$ is supplied to the proof mass of a MEMS mechanism). When $V_{RIGHT}<V_{LEFT}$, the right rectifying buffer circuit 122 is active and when, $V_{RIGHT}>V_{LEFT}$, the left rectifying buffer circuit 120 is active. It should also be noted that positive rectifying buffers may be used rather than negative rectifying buffers to generate a $V_{PM}$ voltage that is the greater of the two torque plate voltages. In either case, the net force on the proof mass is the same. By driving the proof mass in this manner, the offset voltage of the differential amplifier does not contribute to drive errors. Furthermore, the offset voltages of the two rectifying buffers 120, 122 do not contribute to drive errors either. However, the difference or mismatch in the offset voltages of the two rectifying buffers does. As described above, this can be made an order of magnitude less than the actual offset voltage.

g) Conclusion A variety of examples have been described above. More generally, those skilled in the art will understand that changes and modifications may be made to these examples without departing from the true scope and spirit of the present invention, which is defined by the claims. Thus, for example, the accelerometer shown in FIG. 1A may comprise a variety of structures and is not limited to including only the illustrated elements. An accelerometer may include more or fewer sense or torque pads. And the naming or labeling of the elements should not be viewed as limiting. For example, in describing some of the sense and torque pads the label of "left" or "right" is used. These labels may suitably be replaced with "top" or "bottom," "first" or "second," etc. Furthermore, the sense and/or torque pads may be arranged in a variety of ways and the mechanism or cantilevers within an accelerometer may be designed or adapted for a particular application. For example, the mechanism may include both in-plane and out-of-plane structures.

Also, the types of signals received from the control circuitry and communicated to a torque pad may be quite varied. The signaling ranges may also be varied. In some examples, a preferable voltage range for the torque signal may comprise ±15 V. However, depending on the configuration of a torque driver, a variety of output voltage ranges are possible. Further, because electrostatic potential may be independent of the sign of an output voltage signal, positive and negative voltages, in some examples, may be interchangeable.

Accordingly, the description of the present invention is to be construed as illustrative only and is for the purpose of teaching those skilled in the art the best mode of carrying out the invention. The details may be varied substantially without departing from the spirit of the invention, and the exclusive use of all modifications which are within the scope of the appended claims is reserved.

I claim:

1. A torque driver, comprising a rectifying buffer, wherein the buffer comprises:
    an output node for producing a torque signal; and
    a differential input having first and second terminals, wherein the first terminal is coupled to receive a control signal and the second terminal is coupled to receive the torque signal, and wherein the torque signal correlatively responds to a voltage difference across the first and second terminals, and wherein the buffer is configured to prevent the torque signal from following the control signal when the control signal drops below a predetermined threshold.

2. The torque driver as in claim 1, wherein the control signal comprises a voltage signal, and wherein the predetermined threshold is zero volts.

3. The torque driver as in claim 2, wherein the buffer prevents the torque signal from following the control signal when the control signal is at a negative voltage.

4. The torque driver as in claim 2, wherein the buffer prevents the torque signal from following the control signal when the control signal is at a positive voltage.

5. The torque driver as in claim 2, wherein the buffer further comprises:
    a transistor coupled to the output node; and
    an amplifier coupled to the differential input and the transistor.

6. The torque driver as in claim 5, wherein the second terminal is further coupled to receive an offset signal so as to reduce an offset associated with the amplifier.

7. The torque driver as in claim 2, wherein the buffer is for coupling to a fulcrum of an accelerometer.

8. The torque driver as in claim 1, wherein the output node is coupled to a torque pad for responsively adjusting a proof mass beam of an accelerometer, and wherein the control signal is communicated from a control circuit coupled to a deflection sensing circuit.

9. A torque driver, comprising:
    a left rectifying buffer for outputting a left torque signal, wherein the left rectifying buffer comprises a differential input coupled to receive the left torque signal and a control signal, wherein the left torque signal correlatively responds to a voltage difference between the left torque signal and the control signal; and
    a right rectifying buffer for outputting a right torque signal, wherein the right rectifying buffer comprises a differential input coupled to receive the right torque signal and the control signal, wherein the right torque signal correlatively responds to a voltage difference between the right torque signal and the control signal.

10. The torque driver as in claim 9, wherein the control signal is communicated from an accelerometer and the left and right torque signals are provided to torque pads for adjusting a proof mass beam within an accelerometer.

11. The torque driver as in claim 9, wherein when the control signal is positive, the right rectifying buffer is configured to track the control signal so that the right torque signal follows the control signal, and wherein when the control signal is negative, the left rectifying buffer is configured to track the control signal so that the left torque signal follows the control signal.

12. A torque driver, comprising a regulator circuit for receiving an acceleration signal and responsively adjusting a proof mass beam within an accelerometer by a process comprising:
    outputting a first torque signal that follows a control signal and a second torque signal that does not follow the acceleration signal; and
    if the control signal moves out of a range, changing the first and second torque signals so that the second torque signal follows the control signal and the first torque signal does not follow the control signal, wherein the regulator circuit is configured to prevent the first and second torque signals from simultaneously following the control signal.

13. The torque driver as in claim 12, wherein the regulator circuit includes a modulator that is coupled to receive the control signal and a selector signal, and wherein, in operation, the selector signal determines which of the first and second torque signals is to follow the control signal.

14. The torque driver as in claim 13, wherein the modulator is further coupled to receive a bias signal, and wherein the selector signal further determines which of the first and second torque signals is to follow the bias signal.

15. The torque driver as in claim 12, wherein the regulator circuit comprises a first rectifying buffer for outputting the first torque signal and a second rectifying buffer for outputting the second torque signal, and wherein the first and second buffers are each configured to use the control signal to respectively regulate the first and second torque signals.

* * * * *